(12) United States Patent
Fujii

(10) Patent No.: US 11,127,918 B2
(45) Date of Patent: Sep. 21, 2021

(54) DISPLAY DEVICE AND ELECTRONIC APPARATUS

(71) Applicant: Sony Semiconductor Solutions Corporation, Kanagawa (JP)

(72) Inventor: Takuma Fujii, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 16/614,663

(22) PCT Filed: Apr. 27, 2018

(86) PCT No.: PCT/JP2018/017179
§ 371 (c)(1),
(2) Date: Nov. 18, 2019

(87) PCT Pub. No.: WO2018/216432
PCT Pub. Date: Nov. 29, 2018

(65) Prior Publication Data
US 2020/0185639 A1    Jun. 11, 2020

(30) Foreign Application Priority Data

May 23, 2017    (JP) .............................. JP2017-101399

(51) Int. Cl.
*H01L 51/52* (2006.01)
*H01L 27/32* (2006.01)
*G02B 27/01* (2006.01)

(52) U.S. Cl.
CPC ...... *H01L 51/5228* (2013.01); *H01L 27/3244* (2013.01); *G02B 27/0172* (2013.01); *G02B 2027/0178* (2013.01)

(58) Field of Classification Search
CPC combination set(s) only.
See application file for complete search history.

(56) References Cited

U.S. PATENT DOCUMENTS

| 10,381,593 | B2 * | 8/2019 | Hong | ................. | H01L 51/5246 |
| 2005/0200270 | A1 * | 9/2005 | Kwak | ................. | H01L 27/3276 |
| | | | | | 313/502 |
| 2005/0212412 | A1 * | 9/2005 | Kurosawa | ........... | H01L 51/5271 |
| | | | | | 313/504 |
| 2015/0144922 | A1 * | 5/2015 | Moon | ................. | H01L 27/3279 |
| | | | | | 257/40 |
| 2017/0141180 | A1 * | 5/2017 | Matsumoto | ......... | H01L 27/3279 |
| 2018/0061317 | A1 * | 3/2018 | Morita | ................ | H01L 27/1225 |
| 2020/0235175 | A1 * | 7/2020 | Hasegawa | ........... | H01L 27/3276 |

FOREIGN PATENT DOCUMENTS

JP    2014-199739 A    10/2014

* cited by examiner

*Primary Examiner* — Mamadou L Diallo
(74) *Attorney, Agent, or Firm* — Michael Best & Friedrich LLP

(57) ABSTRACT

A display device includes: an organic EL layer formed over a circuit section formed over a substrate, an insulating layer interposed between the circuit section and the organic EL layer; a cathode electrode formed over the organic EL layer in common for all pixels; and a contact electrode that is provided at an outer peripheral portion of an effective pixel region and that electrically connects the cathode electrode and the circuit section. In the display device, the cathode electrode is electrically connected to the contact electrode, on an inner side as compared to an end surface of a film formation area of the organic EL layer.

12 Claims, 12 Drawing Sheets

⇨ : CURRENT PATH

FIG. 6A
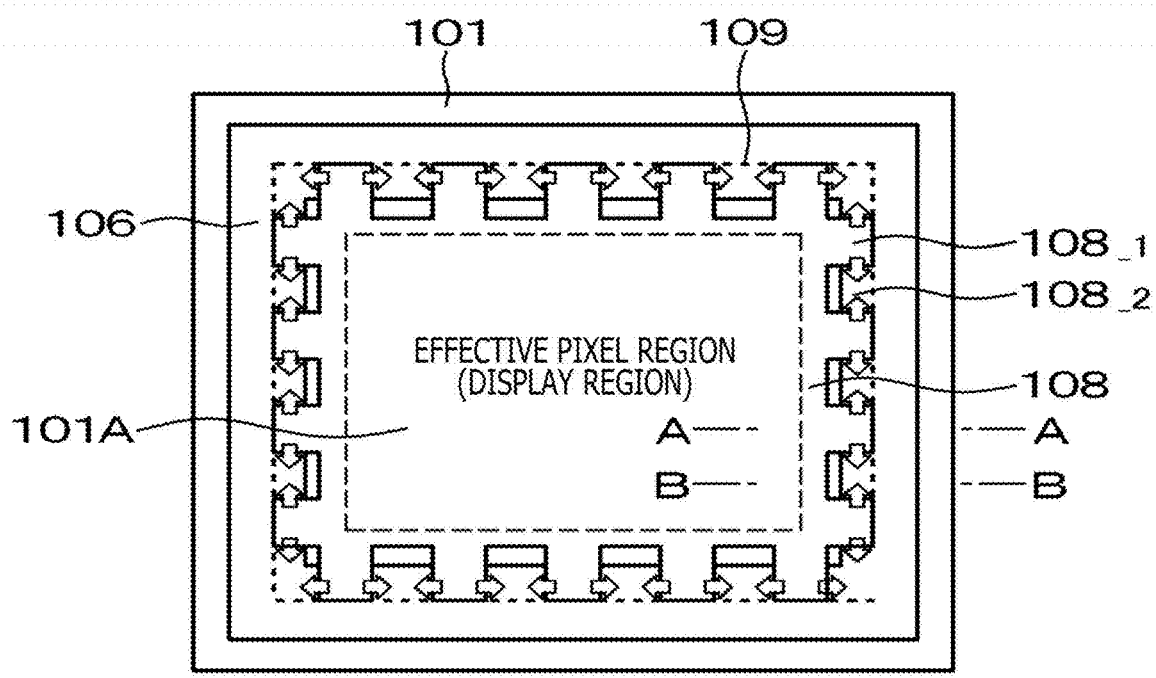
FIG. 6B  ⇨ : CURRENT PATH
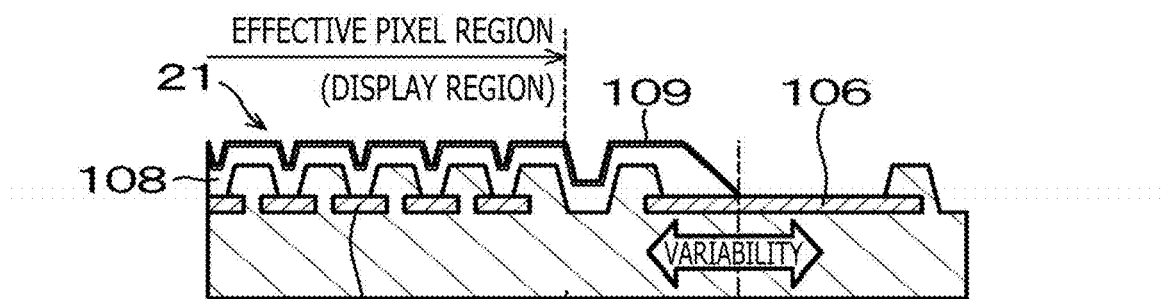
FIG. 6C
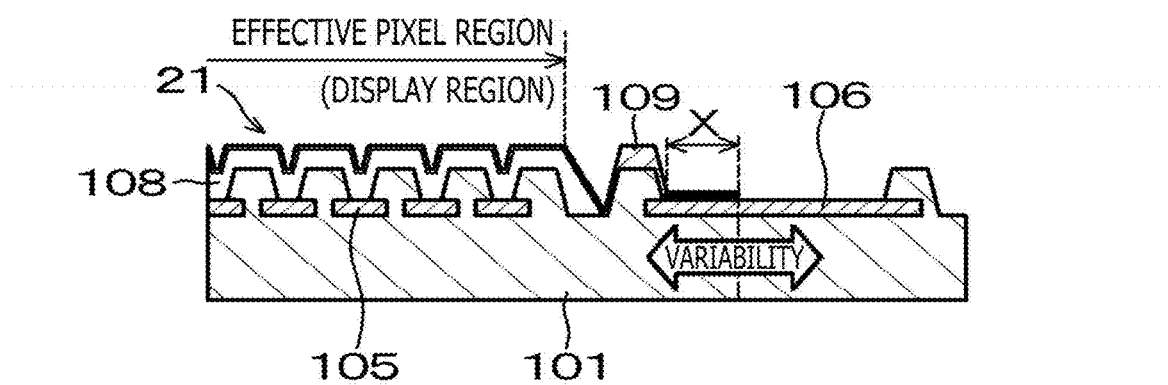

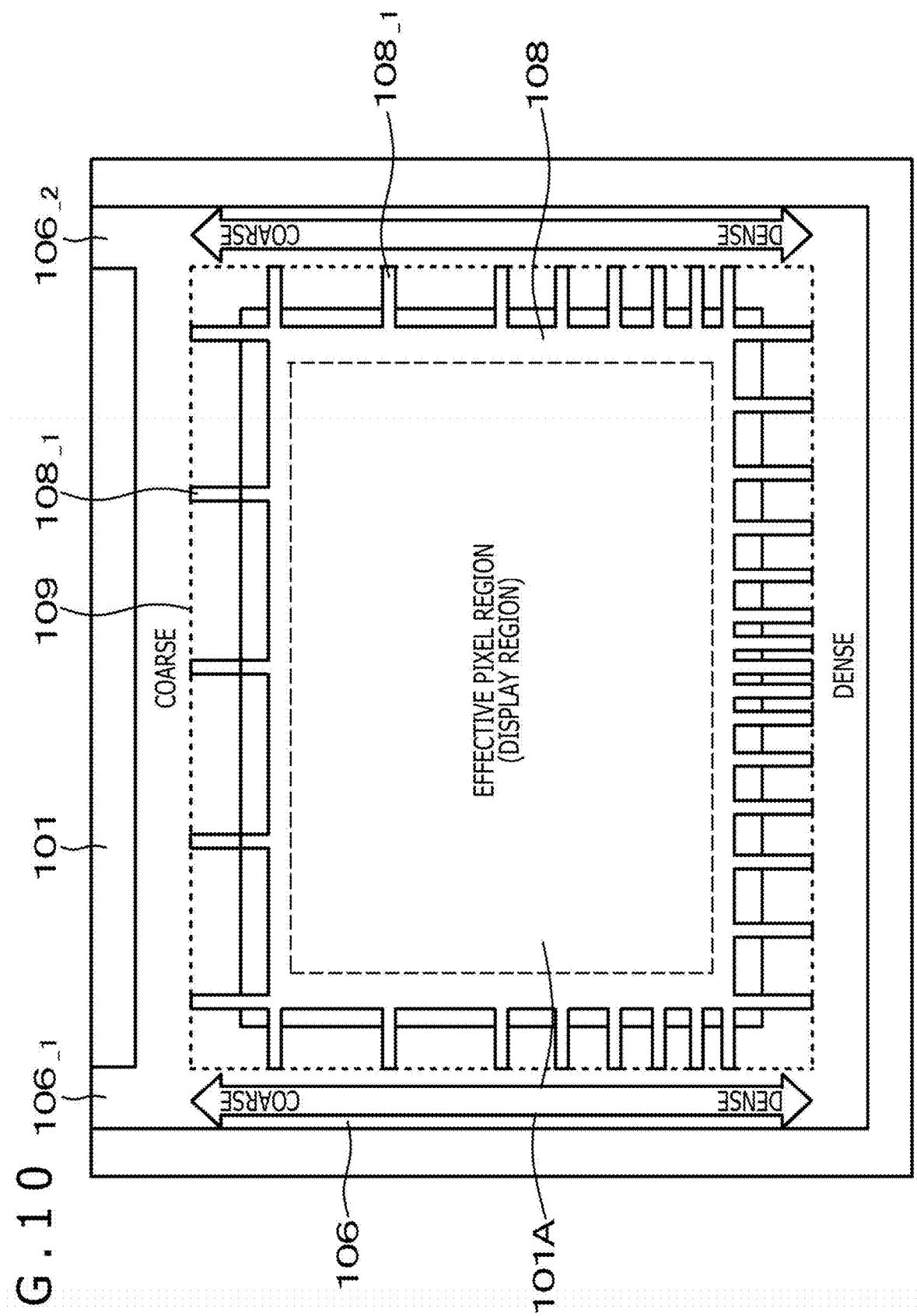

DISPLAY DEVICE AND ELECTRONIC APPARATUS

TECHNICAL FIELD

The present disclosure relates to a display device and an electronic apparatus.

BACKGROUND ART

Of display devices in recent years, the mainstream is flat panel type display devices. As one of the flat panel type display devices, there is a display device in which what is generally called a current driving type electrooptical element that has a light emission luminance varying according to the current passed through the device are used as a light emitting section (light emitting element) of a pixel. As the current driving type electrooptical element, there is known an organic electroluminescence (EL) element in which EL of an organic material is utilized and the phenomenon of light emission upon application of an electric field to an organic thin film is used.

An organic EL display device using an organic EL element as a light emitting section of a pixel generally has a configuration in which an insulating film is provided in a state covering a circuit section formed over a substrate by using thin-film transistors (TFTs), and organic EL elements are arranged and formed over this insulating film. In addition, a cathode electrode as an upper electrode is formed over the organic EL elements in common for all pixels. The cathode electrode should be electrically connected to the circuit section.

In order to electrically connect the cathode electrode with the circuit section, in the past, a configuration has been adopted in which a contact region is provided at an outer peripheral portion of an effective pixel region (display region), and electrical connection between the cathode electrode and the circuit section is made at the contact region (see, for example, PTL 1).

CITATION LIST

Patent Literature

[PTL 1]
Japanese Patent Laid-Open No. 2014-199739

SUMMARY

Technical Problem

Incidentally, the contact region provided at the outer peripheral portion of the effective pixel region for the purpose of providing electrical connection between the cathode electrode and the circuit section constitutes a rate-determining factor for the width of a frame of the display panel (panel peripheral edge portion). When the frame width of the display panel is large, it leads to a rise in manufacturing cost due to a reduction in theoretical yield, and, since there are limitations on the design of the display device mounting product, mechantability as a device is lowered.

In view of the foregoing, it is an object of the present disclosure to provide a display device capable of narrowing a frame of a display panel, in providing a contact region for electrical connection between a cathode electrode and a circuit section at an outer peripheral portion of an effective pixel region, and an electrical apparatus including the display device.

Solution to Problem

In order to achieve the above-mentioned object, according to the present disclosure, there is provided a display device including:

an organic EL layer formed over a circuit section formed over a substrate, with an insulating film interposed between the circuit section and the organic EL layer;

a cathode electrode formed over the organic EL layer in common for all pixels; and a contact electrode that is provided at an outer peripheral portion of an effective pixel region and electrically connects the cathode electrode with the circuit section, in which the cathode electrode is electrically connected to the contact electrode, on an inner side as compared to an end surface of a film formation area of the organic EL layer. In addition, an electronic apparatus according to the present disclosure to achieve the above-mentioned object includes the display device configured as described above.

The configuration in which the cathode electrode is electrically connected to the contact electrode on an inner side as compared to the end surface of the film formation area of the organic EL layer makes it unnecessary to form the cathode electrode in a size larger than the film formation area of the organic EL layer, and, therefore, manufacturing variability of the end surface of the film formation region of the organic EL layer and manufacturing variability of the end surface of the film formation area of the cathode electrode 109 are not required to be taken into account on an addition basis. As a result, the area of the contact region required on the outer side of the effective pixel region can be reduced as compared to the case where the electrical contact of the cathode electrode with the contact electrode is secured on an outer side as compared to the end surface of the film formation area of the organic EL layer.

Advantageous Effects of Invention

According to the present disclosure, in providing the contact region for electrical connection between the cathode electrode and the circuit section at an outer peripheral portion of the effective pixel region, it is possible to reduce the area of the contact region, and, therefore, it is possible to narrow the frame of the display panel. Note that the effects described herein are not limitative, and any of the effects described herein may be present. In addition, the effects described herein are merely illustrative, and are not limitative, and additional effects may be present.

BRIEF DESCRIPTION OF DRAWINGS

FIG. 6A is a schematic configuration diagram, in plan view, depicting a contact structure of a cathode electrode according to Example 1, FIG. 6B is a sectional view taken along line A-A of FIG. 6A, depicting a sectional structure, and FIG. 6C is a sectional view taken along line B-B of FIG. 6A, depicting a sectional structure.

FIG. 10 is a schematic configuration diagram, in plan view, depicting a contact structure of a cathode electrode according to Example 4.

DESCRIPTION OF EMBODIMENTS

Figure 1:
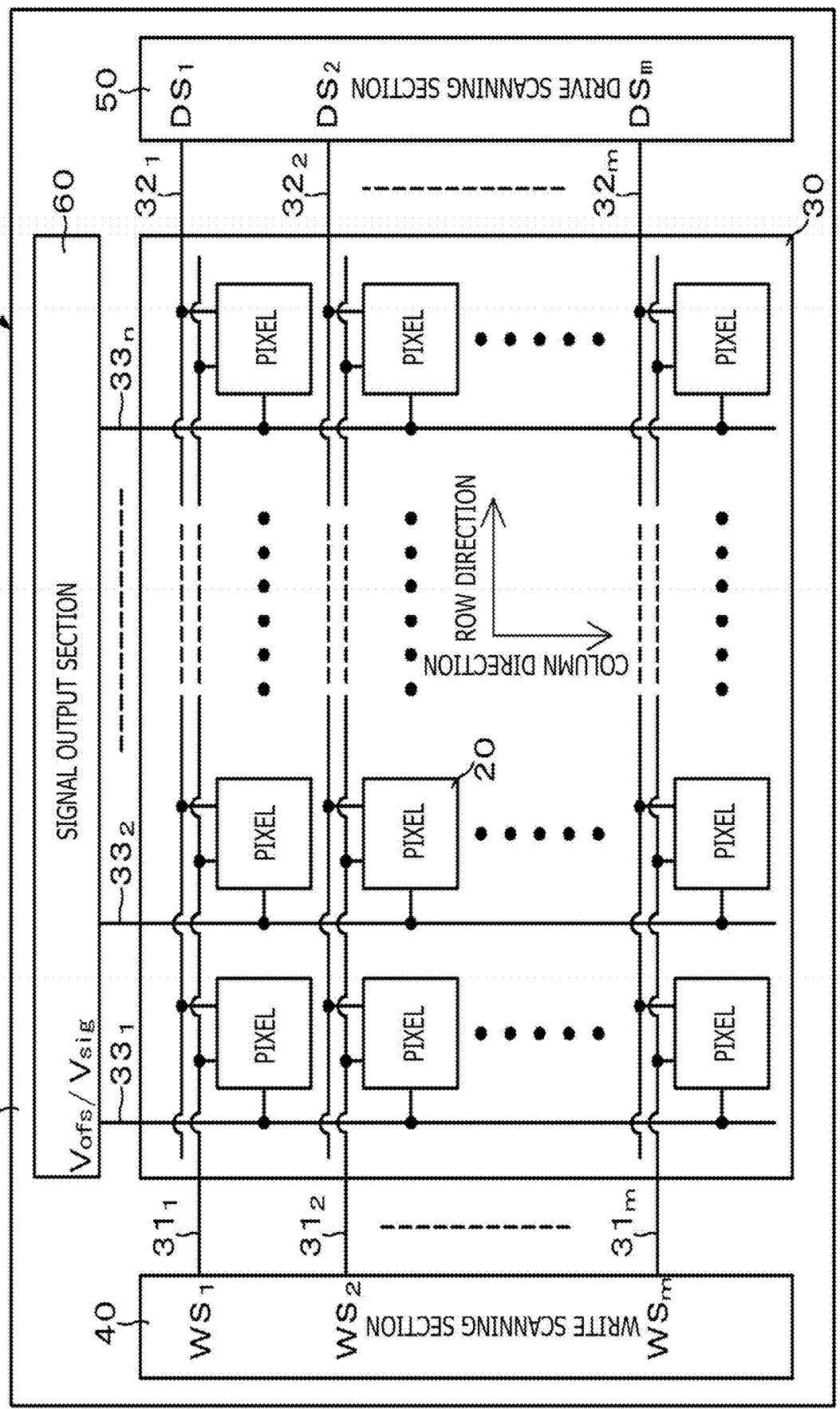
FIG. 1 is a system configuration diagram schematically depicting the configuration of an active matrix type organic EL display device of the present disclosure.

Modes for carrying out the technology of the present disclosure (hereinafter referred to as "embodiments") will be described in detail below referring to the drawings. The technology of the present disclosure is not limited to the embodiments, and various numerical values, materials and so forth in the embodiments are illustrative. In the following description, the same elements or elements having the same functions will be denoted by the same reference signs, and repeated descriptions will be omitted. Incidentally, description will be made in the following order.
1. General description of display device and electronic apparatus of the present disclosure
2. Display device of the present disclosure
   2-1. System configuration
   2-2. Pixel circuit
   2-3. Sectional structure of display panel
   2-4. Contact structure of cathode electrode
   2-5. Example 1 (display device of the present disclosure)
   2-6. Example 2 (modification of Example 1)
   2-7. Example 3 (modification of Example 1)
   2-8. Example 4 (modification of Example 1)
3. Modifications
4. Electronic apparatus of the present disclosure
   4-1. Specific example 1 (example of digital still camera)
   4-2. Specific example 2 (example of head-mounted display)
5. Configuration that can be adopted by the present disclosure <General Description of Display Device and Electronic Apparatus of the Present Disclosure>

In a display device and an electronic apparatus of the present disclosure, an end portion of a film formation area of an organic EL layer may have a projected and recessed shape in a side direction. In addition, a cathode electrode may be configured to be electrically connected to a contact electrode at recessed portions of the projected and recessed shape at the end portion of the film formation area of the organic EL layer.

In the display device and electronic apparatus of the present disclosure including the above-mentioned preferred configurations, projected portions of the projected and recessed shape at the end portion of the film formation area of the organic EL layer may have a rectangular shape, a triangular shape or an arcuate shape. Besides, the projected and recessed shape at the end portion of the film formation area of the organic EL layer may vary in density of the pitch of the projected portions. In this instance, the projected and recessed shape at the end portion of the film formation area of the organic EL layer is preferably configured such that the pitch of the projected portions at a central portion of a side is dense, and the pitch of the projected portions at end portions of the side is coarse.

Further, in the display device and electronic apparatus of the present disclosure including the above-mentioned preferred configurations, a cathode electrode may have a power source supply terminal. In addition, the projected and recessed shape at the end portion of the film formation area of the organic EL layer is preferably configured such that the pitch of the projected portions on a side nearer to the power source supply terminal of the cathode electrode is coarse, and the pitch of the projected portions on a side farther from the power source supply terminal is dense.

<Display Device of Present Disclosure>

The display device of the present disclosure is an active matrix type display device in which a current flowing in an electrooptical element is controlled by an active element, for example, an insulated gate field effect transistor, which is provided in the same pixel circuit as the electrooptical element. Typical examples of the insulated gate field effect transistor include MOS (Metal Oxide Semiconductor) transistor and TFT (Thin Film Transistor).

Here, an active matrix type organic EL display device in which a current driving type electrooptical element having a light emission luminance varying according to a current flowing in a device, for example, an organic EL element, is used as a light emitting section (light emitting element) in a pixel circuit is taken as an example in the following description. In the following description, "the pixel circuit" may be simply described as "the pixel".

[System Configuration]

FIG. 1 is a system configuration diagram schematically illustrating the configuration of an active matrix type organic EL display device of the present disclosure. As depicted in FIG. 1, an organic EL display device 10 of the present disclosure includes a pixel array section 30 in which a plurality of pixels 20 including organic EL elements is two-dimensionally arranged in a matrix pattern, and a peripheral circuit (peripheral drive section) disposed in the periphery of the pixel array section 30.

The peripheral circuit includes, for example, a write scanning section 40, a drive scanning section 50 and a signal output section 60 and the like mounted on the same display panel 70 as the pixel array section 30, and drives each of the pixels 20 in the pixel array section 30. Note that a configuration may be adopted in which some or all of the write scanning section 40, the drive scanning section 50 and the signal output section 60 are provided outside of the display panel 70.

As a substrate of the display panel 70, an insulating transparent substrate such as a glass substrate, or a semiconductor substrate such as a silicon substrate can be used. An organic EL display device using a semiconductor substrate such as a silicon substrate as the substrate of the display panel 70 is what is generally called a micro-display (small-type display), which is suitably used for electronic view finders of digital still cameras, display sections of head-mounted displays, and so on.

The organic EL display device 10 may be configured for monochromic (black-and-white) display, or may be configured for color display. In the case where the organic EL display device 10 is for color display, one pixel (unit pixel) as a unit for forming a color image includes a plurality of sub-pixels. In this instance, each of the sub-pixels corresponds to the pixel 20 in FIG. 1. More specifically, in a display device for color display, one pixel includes, for example, a sub-pixel that emits red (R) light, a sub-pixel that emits green (G) light, and a sub-pixel that emits blue (B) light.

It is to be noted, however, that one pixel is not limited to a combination of the sub-pixels for the three primary colors of RGB, and further a sub-pixel or sub-pixels for one or a plurality of colors may be added to the sub-pixels for the three primary colors to constitute one pixel. More specifically, for example, for enhancing luminance, a sub-pixel for emitting white (W) light may be added in constituting one pixel, or, for enlarging a color reproduction range, at least one sub-pixel for emitting complementary color light may be added in constituting one pixel.

In the pixel array section 30, with respect to the arrangement of the pixels 20 in m rows and n columns, scanning lines 31 ($31_1$ to $31_m$) and drive lines 32 ($32_1$ to $32m$) are arranged along a row direction (the arranging direction of pixels in a pixel row: horizontal direction) on a pixel row basis. Further, with respect to the arrangement of the pixels 20 in m rows and n columns, signal lines 33 ($33_1$ to $33_n$) are arranged along a column direction (the arranging direction of pixels in a pixel column: vertical direction) on a pixel column basis.

The scanning lines $31_1$ to $31_m$ are connected respectively to output ends of the corresponding rows of the write scanning section 40. The drive lines $32_1$ to $32_m$ are connected respectively to output ends of the corresponding rows of the drive scanning section 50. The signal lines $33_1$ to $33_n$ are connected respectively to output ends of the corresponding columns of the signal output section 60.

The write scanning section 40 includes a shift register circuit and the like. This write scanning section 40, at the time of writing signal voltages of video signals to the pixels 20 of the pixel array section 30, performs what is generally called a line sequential scanning in which write scanning signals WS ($WS_1$ to $WS_m$) are sequentially supplied to the scanning lines 31 ($31_1$ to $31_m$) to thereby sequentially scan the pixels 20 of the pixel array section 30 row by row.

The drive scanning section 50 includes a shift register circuit and the like, similarly to the write scanning section 40. This drive scanning section 50 controls light emission/non-light-emission (quenching) of the pixels 20 by supplying light emission control signals DS ($DS_1$ to $DS_m$) to the drive lines 32 ($32_1$ to $32_m$), synchronously with the line sequential scanning by the write scanning section 40.

The signal output section 60 selectively outputs a signal voltage $V_{sig}$ of a video signal according to luminance information supplied from a signal supply source (not illustrated) (hereinafter sometimes described simply as "signal voltage") and a reference voltage $V_{ofs}$. Here, the reference voltage $V_{ofs}$ is a voltage corresponding to a voltage serving as a reference for the signal voltage $V_{sig}$ of the video signal (for example, a voltage corresponding to a black level of the video signal), or a voltage in the vicinity thereof. The reference voltage $V_{ofs}$ is used as an initializing voltage at the time of performing a correcting operation.

The signal voltage $V_{sig}$ or the reference voltage $V_{ofs}$ alternatively outputted from the signal output section 60 is written to the pixels 20 of the pixel array section 30 through the signal lines 34 ($34_1$ to $34_n$) in the unit of the pixel row selected by the line sequential scanning by the write scanning section 40. In other words, the signal output section 60 adopts a driving form of line sequential writing in which the signal voltage $V_{sig}$ is written in the unit of pixel row (line).

[Pixel Circuit]

Figure 2:
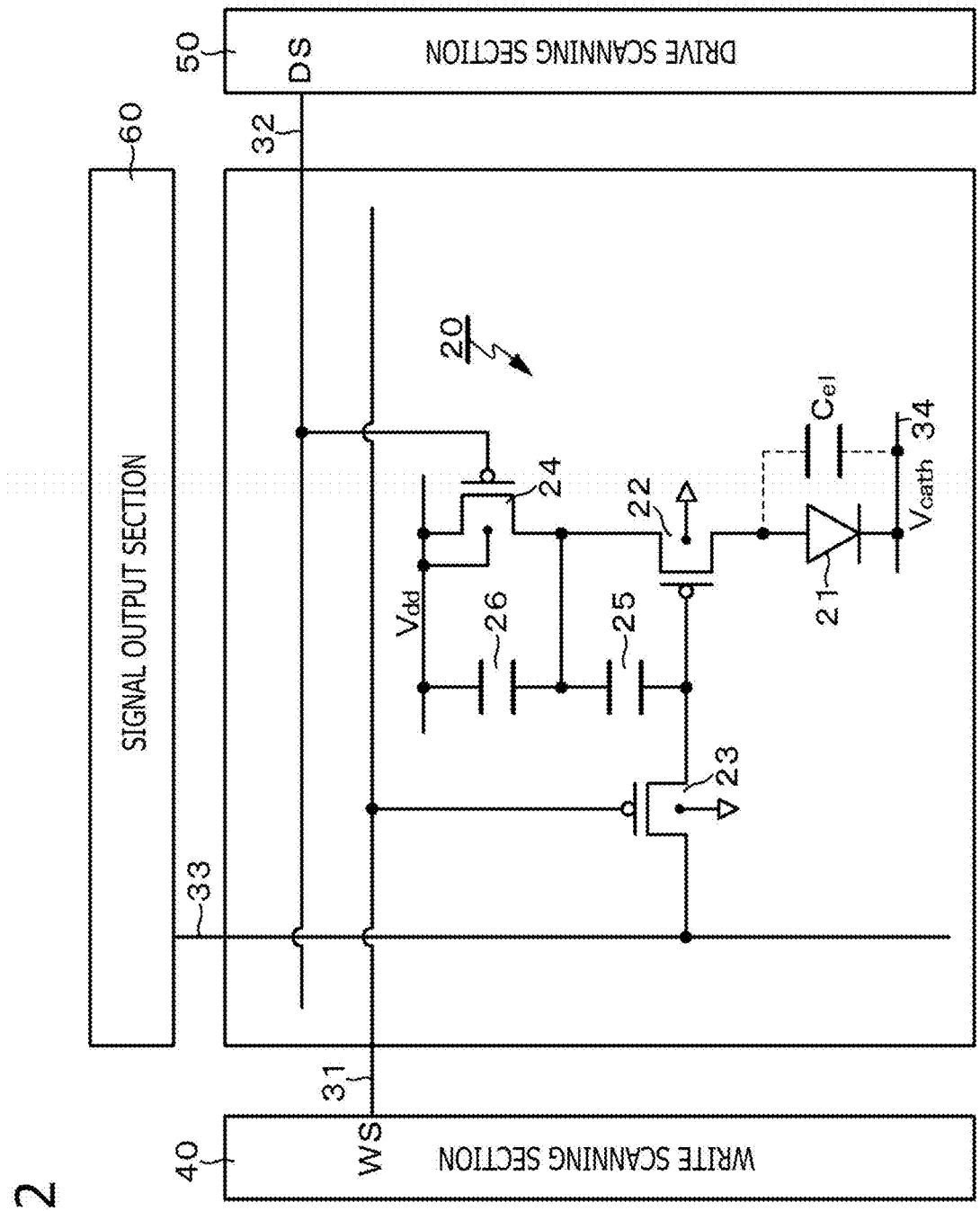
FIG. 2 is a circuit diagram depicting an example of a circuit configuration of a pixel (pixel circuit) in the active matrix type organic EL display device of the present disclosure.

FIG. 2 is a circuit diagram depicting an example of a circuit configuration of a pixel (pixel circuit) in the active matrix type organic EL display device 10 of the present disclosure. A light emitting section of the pixel 20 includes an organic EL element 21. The organic EL element 21 is an example of a current driving type electrooptical element that has a light emission luminance varying according to a current flowing in a device.

As illustrated in FIG. 2, the pixel 20 includes the organic EL element 21, and a driving circuit (pixel driving circuit) that drives the organic EL element 21 by passing a current to the organic EL element 21. The organic EL element 21 has a cathode electrode connected to a common power source line 34 arranged in common for all the pixels 20. In the figure, $C_{el}$ is an equivalent capacitance of the organic EL element 21.

The driving circuit for driving the organic EL element 21 includes a drive transistor 22, a sampling transistor 23, a light emission control transistor 24, a storage capacitor 25, and an auxiliary capacitor 26. Here, it is assumed that the organic EL element 21 and the driving circuit therefor are formed not on an insulating body such as a glass substrate but on a semiconductor substrate such as a silicon substrate, and a configuration using a P channel type transistor as the drive transistor 22 is adopted.

In addition, in this example, a configuration using the P channel type transistor also for the sampling transistor 23 and the light emission control transistor 24, similarly to the drive transistor 22, is adopted. Therefore, the drive transistor 22, the sampling transistor 23 and the light emission control transistor 24 are not of the type of three terminals of source/gate/drain but are of the type of four terminals of source/gate/drain/back gate. A power source voltage $V_{dd}$ is applied on the back gate.

It is to be noted, however, that the sampling transistor 23 and the light emission control transistor 24 are switching transistors functioning as switching elements, and are therefore not limited to P channel type transistors. Accordingly, the sampling transistor 23 and the light emission control transistor 24 may be N channel type transistors, or transistors in which P channel type and N channel type are mixedly present.

In the pixel 20 configured as described above, the sampling transistor 23 samples the signal voltage $V_{sig}$ supplied from the signal output section 60 through the signal line 33, and writes it into the storage capacitor 25. The light emission control transistor 24 is connected between a node of the power source voltage $V_{dd}$ and a source electrode of the drive transistor 22, and controls under the drive by a light emission control signals DS light emission/non-light-emission of the organic EL element 21.

The storage capacitor 25 is connected between a gate electrode and the source electrode of the drive transistor 22. The storage capacitor 25 holds the signal voltage $V_{sig}$ written by the sampling by the sampling transistor 23. The drive transistor 22 drives the organic EL element 21 by causing a drive current according to the voltage held in the storage capacitor 25 to flow in the organic EL element 21.

The auxiliary capacitor 26 is connected between the source electrode of the drive transistor 22 and a fixed-potential node, for example, the node of the power source voltage $V_{dd}$. This auxiliary capacitor 26 operates to restrain a source potential of the drive transistor 22 from fluctuating when the signal voltage $V_{sig}$ is written, and to cause a gate-source voltage $V_{gs}$ of the drive transistor 22 to be a threshold voltage $V_{th}$ of the drive transistor 22.

[Sectional Structure of Display Panel]

Figure 3:
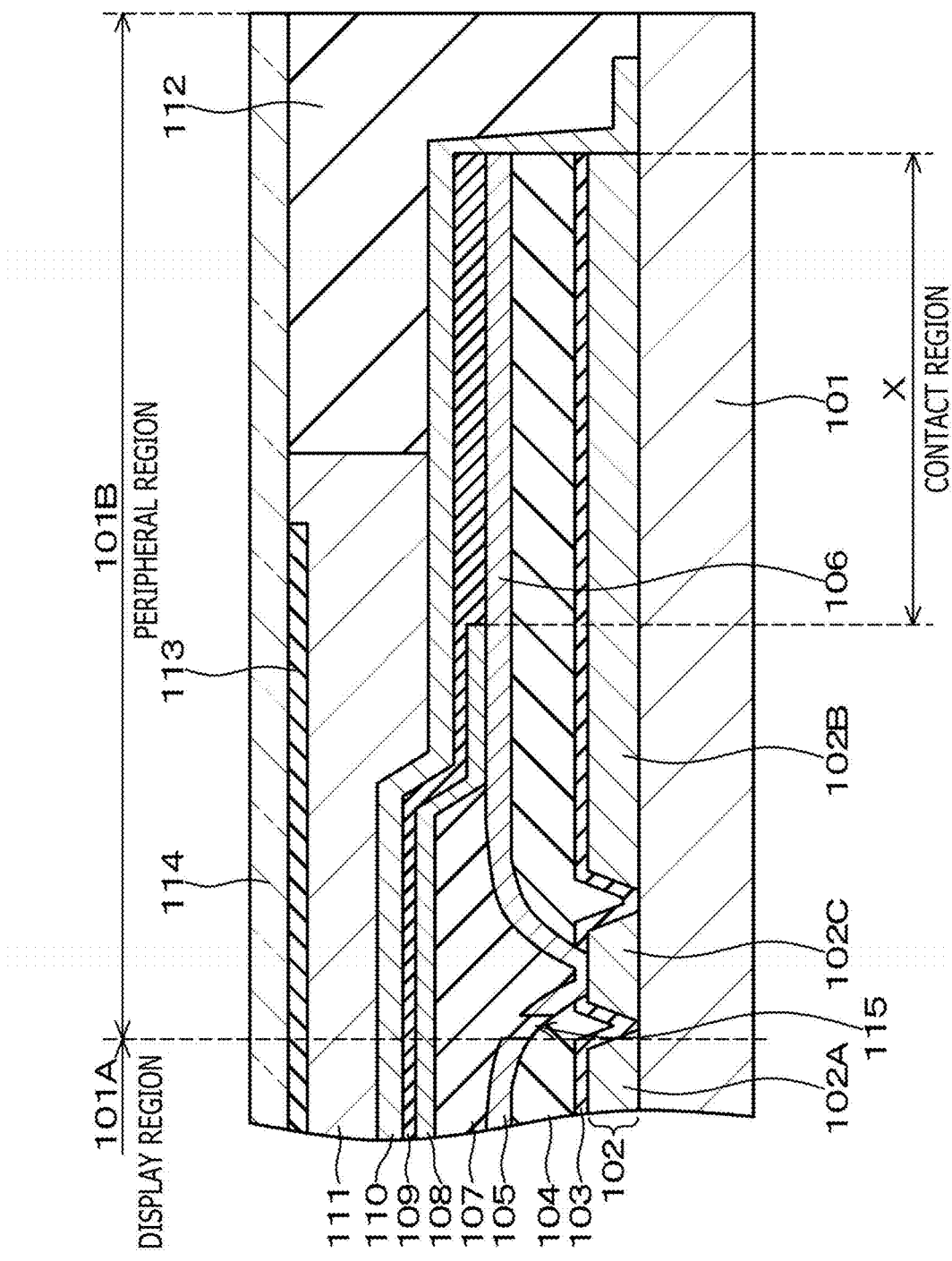
FIG. 3 is a sectional view depicting an example of a sectional structure of a peripheral section of a display panel.

An example of sectional structure of a peripheral edge portion of the display panel 70 is illustrated in FIG. 3. The display panel 70 exemplified here is what is generally called a top emission type display panel in which light in any of the colors of R (red), G (green) or B (blue) is emitted from a panel top surface (a surface on the side opposite to a substrate 101) side by, for example, a combination of a white organic EL element emitting white light and color filters.

A region over the substrate 101 constituting the display panel 70 includes an effective pixel region (display region) 101A in which a plurality of pixels 20 is arranged in a matrix pattern and which corresponds to the pixel array section 30, and a peripheral region 101B located in the periphery (outer edge side; outer periphery side) of the effective pixel region 101A. A pixel drive circuit 102A including the drive transistor 22, the sampling transistor 23, the light emission control transistor 24, the storage capacitor 25 and the auxiliary capacitor 26 is provided in the effective pixel region 101A. A peripheral circuit 102B including the write scanning section 40, the drive scanning section 50 and the signal output section 60 and the like is provided in the peripheral region 101B. In addition, a circuit layer 102 including circuit sections of the pixel drive circuits 102A and the peripheral circuit 102B and a metallic layer 102C is formed over the substrate 101.

The display panel 70 has a stacked structure in which, for example, an inorganic insulating layer layer 103, an organic insulating layer 104, an anode electrode 105 (inclusive of a conductive layer 106 in the same layer), an organic insulating layer 107, an organic EL layer 108, a cathode electrode 109, a protective layer 110, a filler layer (adhesion layer) 111, a sealing material 112, and a black matrix layer 113 are sequentially stacked in this order over the circuit layer 102. Note that, in the same layer as the black matrix layer 113, color filters 115 (see FIG. 4) are provided on a pixel basis. In addition, a sealing substrate 114 is adhered onto this stacked structure, to seal the stacked structure.

In the above-mentioned stacked structure, the anode electrode 105 and the conductive layer 106 are conductive films formed using the same material in the same step and are separated from each other by an opening 115, and both regions are electrically non-conductive with each other. Besides, the conductive layer 106 is electrically connected to the metallic layer 102C of the circuit layer 102 at an end portion on the anode electrode 105 side.

The metallic layer 102C has a function as a wiring layer for the circuit sections of the pixel drive circuit 102A and the peripheral circuit 102B, and has a function as a wiring layer (electrode) for electrically connecting the cathode electrode 109 to the circuit sections (securing contact of the cathode electrode 109 with the circuit sections). In FIG. 3, a region from an end surface of a film formation area of the organic EL layer 108 to an end surface of a film formation area of the cathode electrode 109 is a contact region X to secure contact between the conductive layer 106 having the function as a cathode contact electrode and the cathode electrode 109. As the material for the metallic layer 102C, for example, simple substances of metallic element such as aluminum (Al), copper (Cu) and titanium (Ti) or alloys thereof can be used.

The inorganic insulating layer 103 is formed substantially uniformly over the circuit layer 102. As the material for the inorganic insulating layer 103, for example, inorganic materials such as silicon oxide ($SiO_x$), silicon nitride ($SiN_x$), silicon oxynitride ($SiN_xO_y$), titanium oxide ($TiO_x$) and aluminum oxide ($Al_xO_y$) can be used.

The organic insulating layers 104 and 107 function as an inter-pixel insulating layer, and the organic insulating layer 104 is formed on the lower layer side, whereas the organic insulating layer 107 is formed on the upper layer side. The organic insulating layer 104 on the lower layer side is formed over the substrate 101 such as to extend from the effective pixel region 101A to its exterior region (for example, an end portion of the substrate 101 through the peripheral region 101B). The organic insulating layer 107 on the upper layer side is formed from the effective pixel region 101A to part of the peripheral region 101B (for example, the peripheral region 101B near the effective pixel region 101A, and its end surface is covered with the organic EL layer 108. As the material or materials for the organic insulating layers 104 and 107, for example, organic materials such as polyimide, acrylic and novolak resins or siloxanes can be used.

The anode electrode 105, the organic EL layer 108 and the cathode electrode 109 are in a stacked structure constituting the white organic EL element described above. The anode electrode 105 is provided on the basis of the pixel 20 of each color in the effective pixel region 101A. In addition, in the exterior region of the effective pixel region 101A (mainly, the peripheral region 101B), the anode electrode 105 is formed in an extending manner, and the conductive layer 106 cut by the opening 115 is formed substantially uniformly. Specifically, the anode electrode 105 and the conductive layer 106 are formed using the same material in the same step. As the anode electrode 105 and the conductive layer 106, for example, metallic materials such as aluminum (Al), or a stack of ITO (indium tin oxide) and silver (Ag) can be used.

The organic EL layer 108 is formed over the conductive layer 106 and the organic insulating layer 107 in such a manner as to extend from the effective pixel region 101A to part of the peripheral region 101B. Details of the specific structure of the organic EL layer 108 will be described later.

The cathode electrode 109 includes a transparent electrode, and is provided in the effective pixel region 101A as a common electrode for the pixels 20. As the material for the cathode electrode 109, for example, materials such as ITO, IZO (indium zinc oxide) and ZnO (zinc oxide) can be used.

The cathode electrode 109 is formed over the substrate 101 such as to extend from the effective pixel region 101A to its exterior region (for example, an end portion of the peripheral region 102B). Specifically, the cathode electrode 109 is formed in an extended region as compared to the organic EL layer 108 provided over the conductive layer 106 through a part covering an end surface of the organic insulating layer 152. In this extended region, the anode electrode 105 and the conductive layer 106 are directly stacked.

In addition, the cathode electrode 109 is stacked directly on the conductive layer 106 in the peripheral region 101B as described above. As a result, in the aforementioned contact region X, the cathode electrode 109 and the metallic layer 102A are electrically connected through the conductive layer 106. With the contact region X thus provided such as to surround the effective pixel region 101A, decrease in luminance at a central portion of the display panel 70 can be restrained.

The protective layer 110 is formed over the cathode electrode 109, and is formed continuously to a position on the substrate 101 in such a manner as to, for example, cover end surfaces of the peripheral circuit 102B, the inorganic insulating layer 103, the organic insulating layer 104, the conductive layer 106 and the cathode electrode 109. As the material for this protective layer 110, for example, inorganic materials such as silicon oxide ($SiO_x$), silicon nitride ($SiN_x$), silicon oxynitride ($SiN_xO_y$), titanium oxide ($TiO_x$) or aluminum oxide ($Al_xO_y$) can be used.

The filler layer 111 is formed substantially uniformly over the protective layer 110, and functions as an adhesion layer. As the material for this filler layer 111, for example, epoxy resin, acrylic resins or the like can be used.

The sealing material 112 is disposed at an end portion (end edge portion) of the substrate 101, and is a member for sealing each layer between the substrate 101 and the sealing substrate 114 from the exterior. As the material for the sealing material 112 as well, for example, epoxy resin, acrylic resins or the like can be used.

The sealing substrate 114 seals the white organic EL element, together with the filler layer 111 and the sealing material 112. The sealing substrate 114 includes a material such as glass which is transparent to light in each color emitted from red pixels, green pixels and blue pixels. On a surface on the substrate 101 side of this sealing substrate 114, color filters including, for example, red filters, green filters and blue filters are provided respectively at positions corresponding to the pixels 20, and the black matrix layer 113 is provided as a light shielding film between the pixels 20.

As a result, white light emitted from each of the white organic EL elements in the red pixels, green pixels and blue pixels is transmitted through each of the above-mentioned color filters, whereby red light, green light and blue light are emitted respectively. In addition, external light reflected in the red pixels, green pixels and blue pixels and on wirings therebetween is absorbed, whereby contrast is improved.

Figure 4:
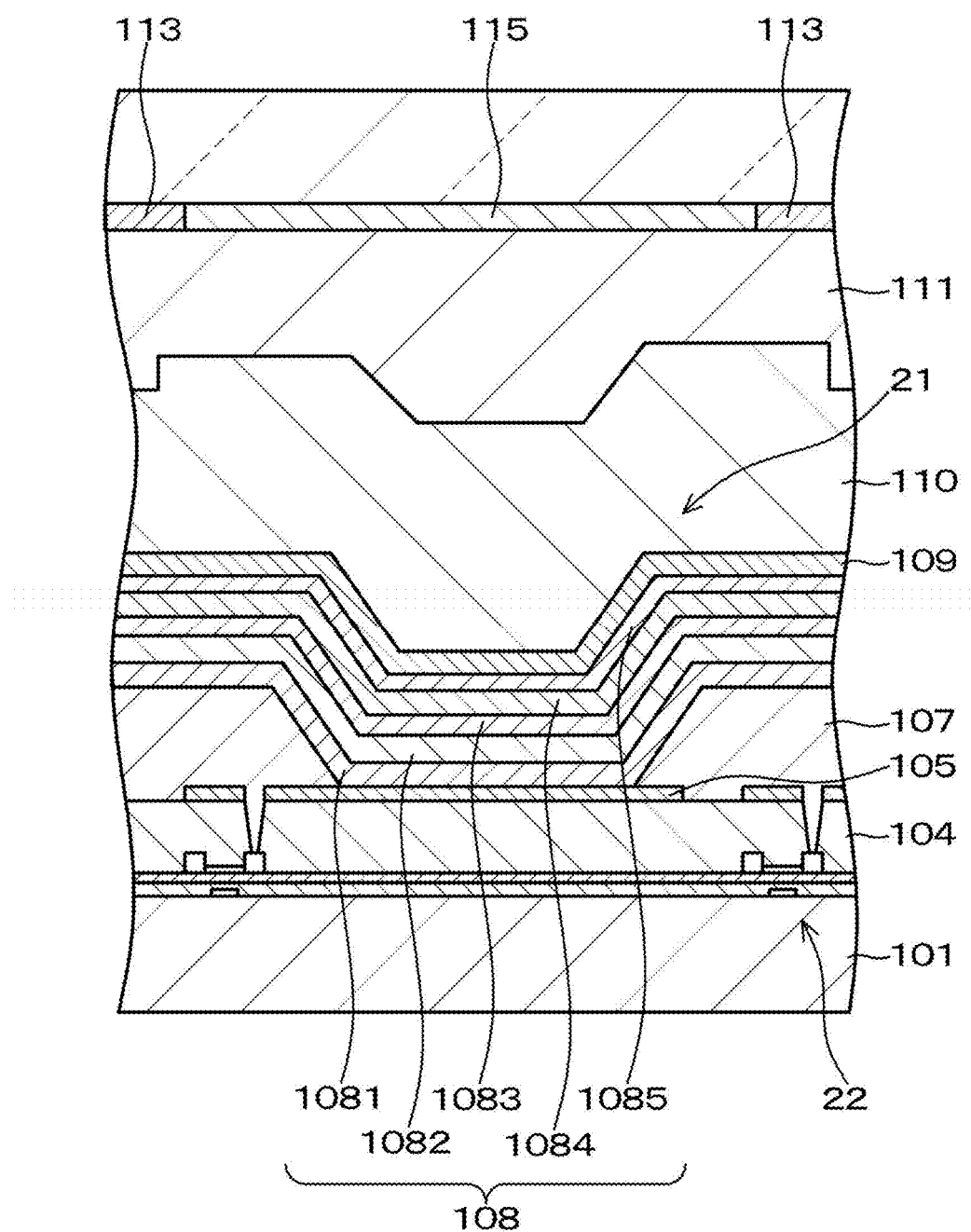
FIG. 4 is a sectional view depicting an example of a sectional structure of an organic EL layer.

Details of the specific structure of the organic EL layer 108 will be described using FIG. 4. FIG. 4 is a sectional view depicting an example of a sectional structure of the organic EL layer 108.

As illustrated in FIG. 4, the organic EL layer 108 has a stacked structure in which a hole injection layer 1081, a hole transport layer 1082, a light emitting layer 1083, an electron transport layer 1084 and an electron injection layer 1085 are sequentially stacked in this order from the anode electrode 105. Of these layers, layers other than the light emitting layer 1082 are only required to be provided as needed. The hole injection layer 1081 is provided for enhancing hole injection efficiency and preventing leakage. The hole transport layer 1082 is an element for enhancing efficiency of hole transfer to the light emitting layer 1083. The light emitting layer 1083 is an element for generating light through recombination of electrons and holes caused by application of an electric field. The electron transport layer 1084 is an element for enhancing efficiency of electron transfer to the light emitting layer 1083. The electron injection layer 1085 is an element for enhancing electron injection efficiency. Note that the constituent material of the organic EL layer 108 is not particularly limited, and general low-molecular or polymeric organic materials can be used.

As described above, the organic EL display device 10 according to the present embodiment has a configuration in which the organic insulating layer 104 is provided in a state covering the circuit section (the pixel drive circuit 102A and the peripheral circuit 102B) formed over the substrate 101, and the organic EL elements 21 are formed over the organic insulating layer 104. The anode electrodes 105 as lower electrodes are provided under the organic EL elements 21 on a pixel basis, whereas the cathode electrode 109 as an upper electrode is provided over the organic EL elements 21 in common for all the pixels.

[Contact Structure of Cathode Electrode]

The cathode electrode 109 should be electrically connected to the circuit section formed over the substrate 101. For realizing this electrical connection, in the organic EL display device 10 according to the present embodiment, the contact region X is provided at an outer peripheral portion of the effective pixel region (display region) 101A, and electrical connection of the cathode electrode 109 with the circuit section is made at the contact region X (see FIG. 3). More specifically, the cathode electrode 109 is electrically connected to the metallic layer 102C of the circuit layer 102 through the conductive layer 106 formed over the organic insulating layer 104 and having the function as a cathode contact electrode.

The contact region X of the cathode electrode 109 constitutes a rate-determining factor for the width of a frame (panel peripheral edge portion) of the display panel 70. Therefore, in consideration of the manufacturing variability of the end surface of the film formation area of the organic EL layer 108 and the end surface of the film formation area of the cathode electrode 109, the frame width should satisfy the following conditions.

The organic EL layer 108 necessarily covers the effective pixel region 101A, and the end surface of the film formation area of the organic EL layer 108 is present on the contact region X. This condition is for preventing a situation in which, under the influence of a step of the circuit layer 102, the cathode electrode 109 suffers what is generally called stepping, resulting in an electrically open state.

The contact region X satisfies a desired width (area), for reducing the contact resistance between the cathode contact electrode (i.e., the conductive layer 106) and the cathode electrode 109.

Figure 5A:
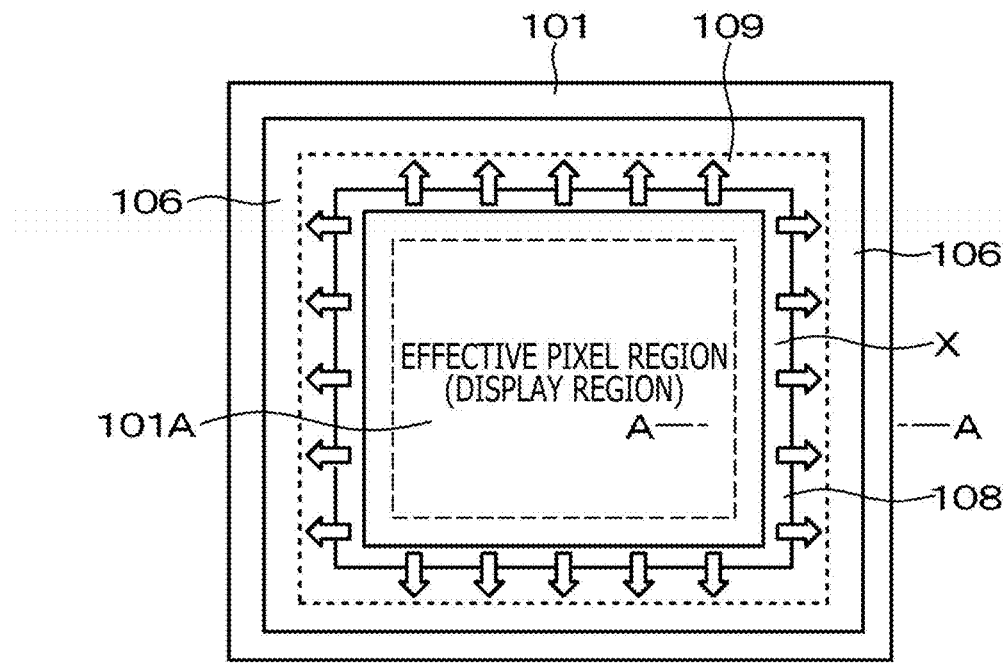
FIG. 5A is a schematic configuration diagram, in plan view, explaining a contact structure of a cathode electrode according to an example in related art.
Figure 5B:
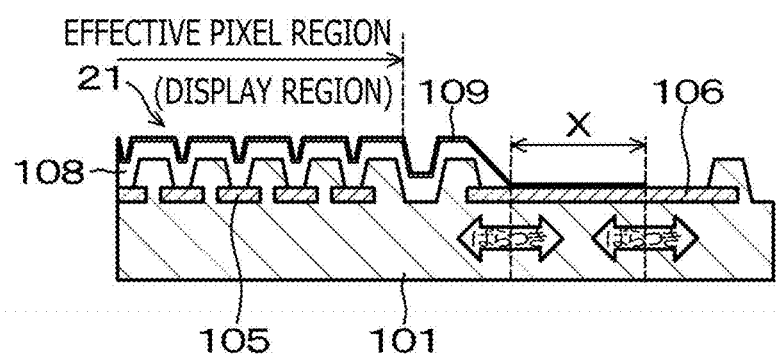
FIG. 5B is a sectional view taken along line A-A of FIG. 5A, depicting a sectional structure.

The contact structure of the cathode electrode 109 depicted in FIG. 3 corresponds to an example in related art. The example in related art for the contact structure of the cathode electrode 109 will be specifically described below using FIGS. 5A and 5B. FIG. 5A is a schematic diagram, in plan view, for explaining the contact structure of the cathode electrode according to the example in related art, and FIG. 5B is a sectional view taken along line A-A of FIG. 5A.

In order to obtain a frame width satisfying the above-mentioned conditions, in the contact structure of the cathode electrode according to the example in related art, the cathode electrode 109 is formed in a size larger than the film formation area of the organic EL layer 108, and is formed such that an end portion is tapered, to prevent stepping from occurring due to a step in the ground. The cathode electrode 109 is electrically connected to the conductive layer 106 serving as a cathode contact electrode, at the contact region X on the outer side as compared to the end surface of the film formation area of the organic EL layer 108.

In FIG. 5A, the outline arrows represent current paths between the cathode electrode 109 and the cathode contact electrode. In the contact structure of the cathode electrode 109 according to the example in related art, the current paths pass through the cathode electrode 109 over the organic EL layer 108, and, therefore, there is no influence of the step in the ground, and stepping does not occur.

It is to be noted, however, that in the contact structure of the cathode electrode 109 according to the example in related art, the cathode electrode 109 is formed in a size larger than the film formation area of the organic EL layer 108, and the contact of the cathode electrode 109 with the cathode contact electrode is secured on the outer side as compared to the end surface of the film formation area of the organic EL layer 108, and, therefore, the following problems would arise.

Specifically, since manufacturing variability of the end surface of the film formation area of the organic EL layer 108 and manufacturing variability of the end surface of the film formation area of the cathode electrode 109 should be taken into account on an addition basis, the area of the contact region X required on the outer side of the effective pixel region (display region) 101A becomes large, inevitably enlarging the frame width of the display panel 70. When the frame width of the display panel 70 is large, it leads to a rise in manufacturing cost due to a lowered theoretical yield, and, since the design of the display device mounting product will be restricted, merchantability as a device will be lowered.

In view of this, in the present embodiment, the cathode electrode 109 is electrically connected to the conductive layer 106 serving as the cathode contact electrode, on the inner side as compared to the end surface of the film formation area of the organic EL layer 108. As a result, it becomes unnecessary for the cathode electrode 109 to be formed in a size larger than the film formation area of the organic EL layer 108; accordingly, manufacturing variability of the end surface of the film formation area of the organic EL layer 108 and manufacturing variability of the end surface of the film formation area of the cathode electrode 109, are not required to be taken into account on an addition basis.

Consequently, the area of the contact region X required on the outer side of the effective pixel region 101A can be reduced, as compared to the case in which the contact between the cathode electrode 109 and the cathode contact electrode is secured on the outer side as compared to the end surface of the film formation area of the organic EL layer 108, and, therefore, it is possible to narrow the frame of the display panel 70. Since a narrower frame of the display panel 70 increases the theoretical yield, a reduction in manufacturing cost can be realized, and, since the limitations on the design of the display device mounting product can be restrained, merchantability as a device can be enhanced.

Particularly in a micro-display (small type display) using a semiconductor substrate such as a silicon substrate as the substrate of the display panel 70, the proportion of the effective pixel region 101A based on the size of the substrate 101 (chip size) is small, and, therefore, the influence of the size of the outer peripheral portion of the effective pixel region 101A becomes conspicuous. From such a point of view as well, the present technology which can narrow the frame of the display panel 70 will particularly be useful for the micro-display.

Specific examples of the contact structure of the cathode electrode 109 to reduce the area of the contact region X and to narrow the frame of the display panel 70 will be described below.

Example 1

Example 1 is an example of the contact structure of the cathode electrode 109 to reduce the area of the contact region X and to narrow the frame of the display panel 70. A schematic configuration, in plan view, of the contact structure of the cathode electrode 109 according to Example 1 is illustrated in FIG. 6A, a sectional structure along line A-A of FIG. 6A is depicted in FIG. 6B, and a section taken along line B-B of FIG. 6A is illustrated in FIG. 6C.

As is clear from FIG. 6A, end portions of the film formation area of the organic EL layer 108 have a projected and recessed shape (what is generally called a comb-tooth shape) in side directions (vertical and horizontal directions in the figure). In this contact structure, projected portions $108_{-1}$ of the projected and recessed shape have a rectangular shape. In other words, the projected portions $108_{-1}$ are shaped such that their side surfaces are perpendicular to the effective pixel region 101A.

In addition, the cathode electrode 109 is formed in the same size as the film formation area of the organic EL layer 108. In other words, in the present example, the film formation area of the cathode electrode 109 and the film formation area of the organic EL layer 108 have the same size. It is to be noted, however, that the film formation area of the cathode electrode 109 is not required to have the same size as the film formation area of the organic EL layer 108 and may have a size smaller than the film formation area of the organic EL layer 108.

In the contact structure in which the end portions of the film formation area of the organic EL layer 108 have a projected and recessed shape, the cathode electrode 109 is electrically connected to the cathode contact electrode (conductive layer 106) on the inner side as compared to the end surfaces of the film formation area of the organic EL layer 108 (top surfaces of the projected portions $108_{-1}$), more specifically, at recessed portions $108_{-2}$ of the projected and recessed shape.

Since the end portions of the film formation area of the organic EL layer 108 are made to have the projected and recessed shape and the cathode electrode 109 is made to be electrically connected to the cathode contact electrode at the recessed portions $108_{-2}$, as described above, the cathode electrode 109 can be formed in a size which is the same as or smaller than the size of the film formation area of the organic EL layer 108. As a result, the area of the contact region X can be reduced by an amount by which the cathode electrode 109 has protruded to the outer side from the end surface of the film formation area of the organic EL layer 108 in a case in which the contact between the cathode electrode 109 and the cathode contact electrode is secured on the outer side as compared to the end surface of the film formation area; therefore, it is possible to narrow the frame of the display panel 70. In addition, since the current paths pass through the cathode electrode 109 over the organic EL layer 108, stepping would not occur. These operations and effects apply similarly to the following examples.

Example 2

Example 2 is a modification of Example 1, and is another shape example of the projected portions $108_{-1}$ of the projected and recessed shape at the end portion of the film formation area of the organic EL layer 108. An example of the other shape of the projected portions 108$_{-1}$ of the projected and recessed shape in the contact structure of the cathode electrode according to Example 2 is depicted in FIG. 7A, and another example of the other shape is depicted in FIG. 7B.

Figure 7A:
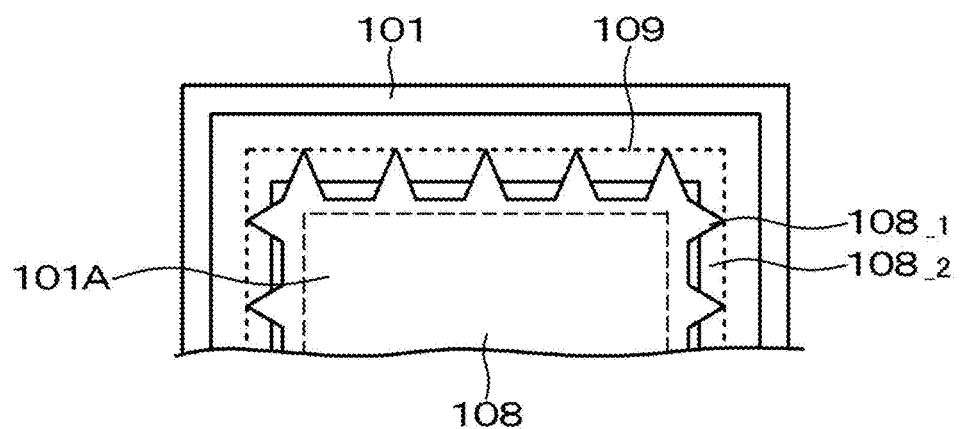
FIG. 7A is a schematic configuration diagram, in plan view, depicting an example of another shape of projected portions of a projected and recessed shape in a contact structure of a cathode electrode according to Example 2.
Figure 7B:
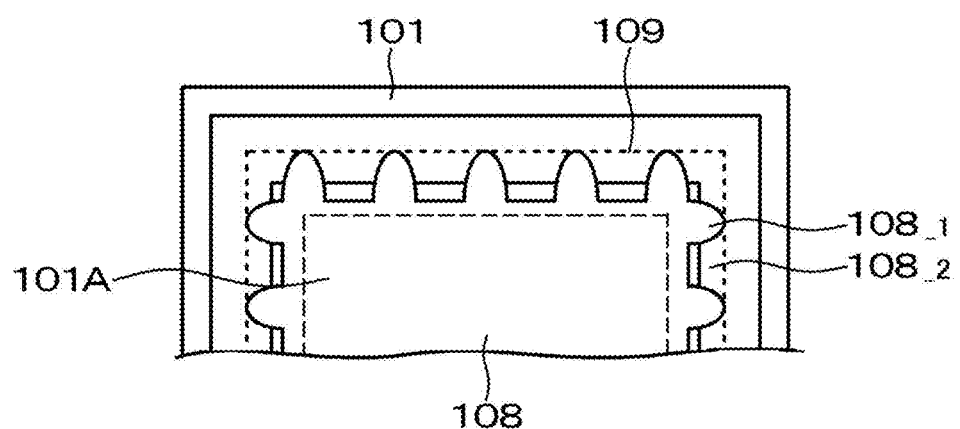
FIG. 7B is a schematic configuration diagram, in plan view, depicting another example of the other shape.

In Example 1, the projected portions 108$_{-1}$ have a rectangular shape, whereas in the example depicted in FIG. 7A, the projected portions 108$_{-1}$ have a triangular shape. In other words, the projected portions 108$_{-1}$ are shaped such that their side surfaces are oblique relative to the effective pixel region 101A. In the example depicted in FIG. 7B, the projected portions 108$_{-1}$ have an arcuate shape inclusive of circular and elliptical arc shapes.

With the projected portions 108$_{-1}$ having a triangular shape or arcuate shape as described above, the peripheral length of the film formation ends (the end portions of the film formation area) of the organic EL layer 108 can be made longer as compared to the case in which the projected portions 108$_{-1}$ have a rectangular shape. As the peripheral length of the film formation ends of the organic EL layer 108 can be made longer, the width of the current paths is enlarged, and resistance in the current paths can be lowered, thereby restraining voltage drop in the organic EL elements 21. As a result, lowering of driving voltage for the organic EL elements 21 can be realized, and power consumption of the organic EL display device 10 as a whole can be reduced.

Example 3

Figure 8:
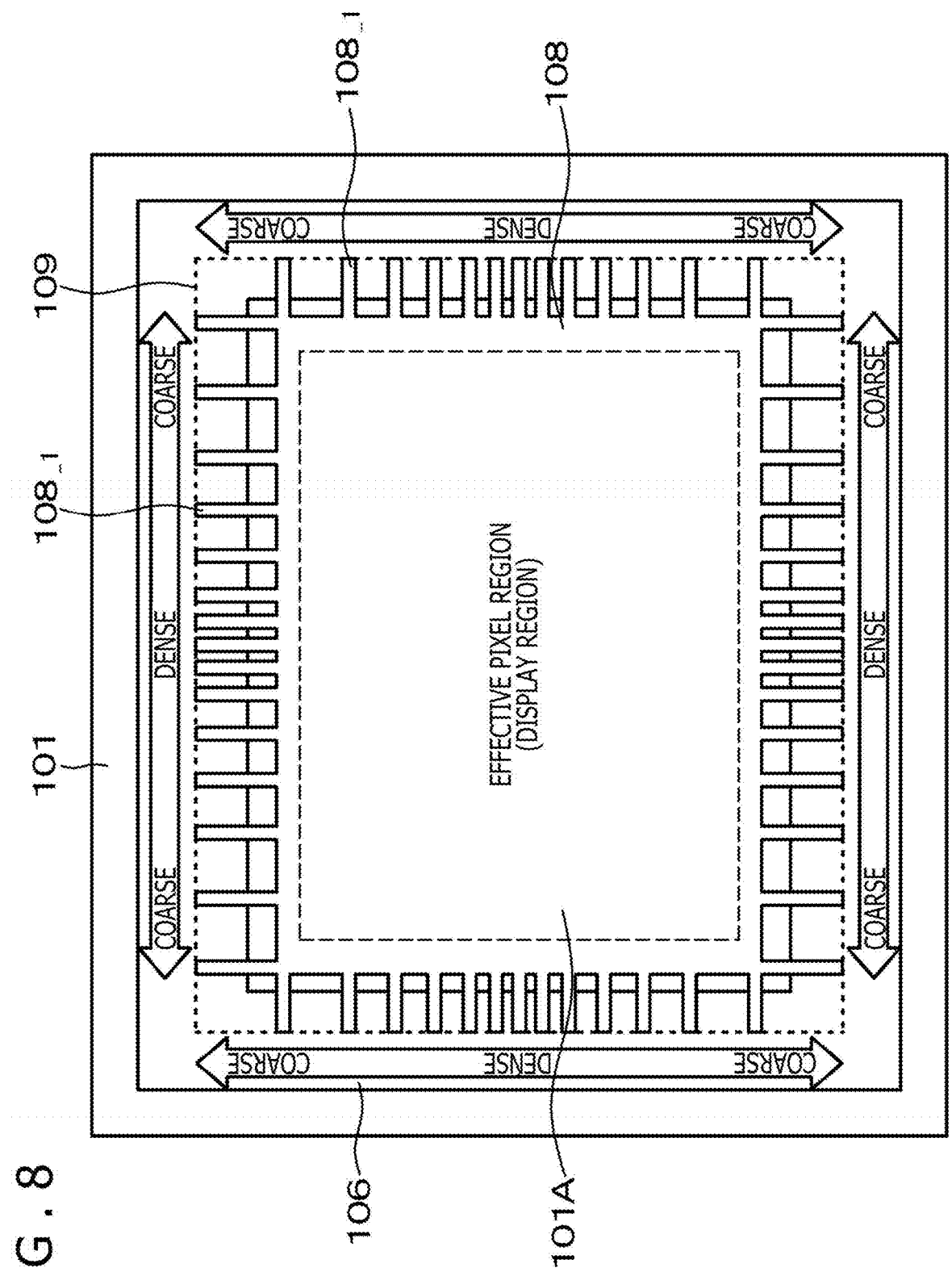
FIG. 8 is a schematic configuration diagram, in plan view, depicting a contact structure of a cathode electrode according to Example 3.

Example 3 is a modification of Example 1, and is an example in which the projected and recessed shape at the end portion of the film formation area of the organic EL layer 108 has a variation in density of the pitch of the projected portions 108$_{-1}$ according to the position of a side of the film formation area of the organic EL layer 108 that has a rectangular shape. A schematic configuration, in plan view, of the contact structure of the cathode electrode 109 according to Example 3 is depicted in FIG. 8.

In the contact structure of the cathode electrode 109 according to Example 1, the pitch of the projected portions 108$_{-1}$ is constant, whereas in the contact structure of the cathode electrode 109 according to Example 3, there is a variation in density of the pitch of the projected portions 108$_{-1}$ along each side of the film formation area of the organic EL layer 108 that has a rectangular shape. More specifically, in each side of the film formation area of the organic EL layer 108 that has a rectangular shape, the pitch of the projected portions 108$_{-1}$ at a central portion of a side is dense, and the pitch of the projected portions 108$_{-1}$ becomes coarser in going toward the end portions of the side.

Figure 9A:
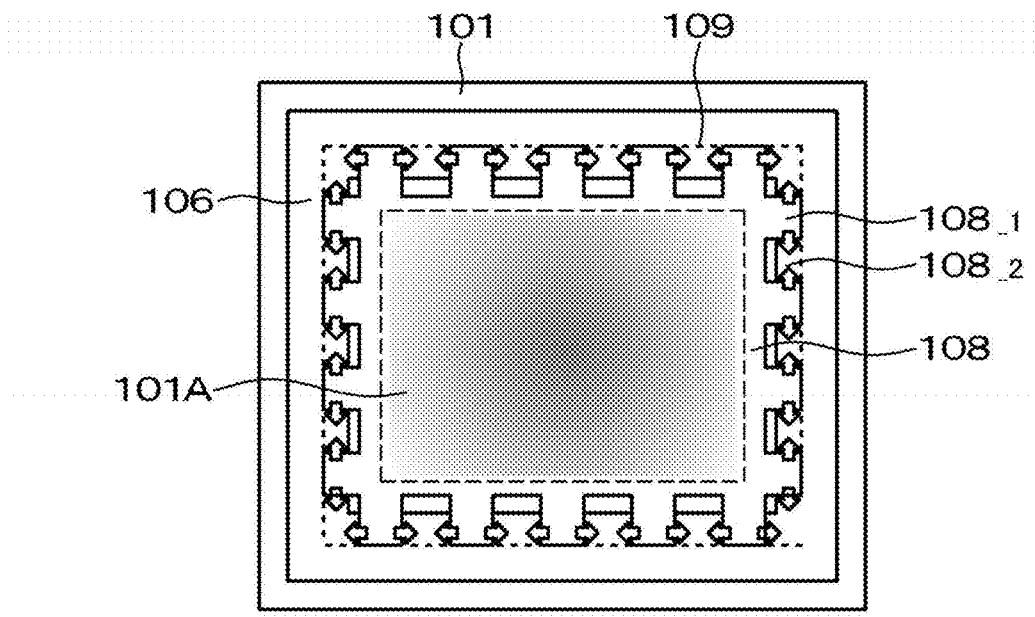
FIG. 9A is a diagram depicting a difference in light emission luminance attendant on a voltage drop difference between a central portion and a peripheral portion of a display panel.

In the display panel 70, voltage drop increases in going closer to the panel center. Therefore, as depicted in FIG. 9A, in the display panel 70, the light emission luminance in a panel central area is decreased as compared to the light emission luminance in a panel peripheral area.

On the other hand, for example, by setting the pitch of the projected portions 108$_{-1}$ at a central portion of each side of the film formation region of the organic EL layer 108 that has a rectangular shape to be dense and setting the pitch of the projected portions 108$_{-1}$ to be coarser in going toward the end portions of the side, the peripheral length of the film formation end of the organic EL layer 108 at the central portion of the side can be made longer than that at the end portions of the side. As a result, the width of the current paths at the central portion of the side is made larger than that at the end portions of the side, and resistance in the current paths can be lowered. Consequently, a voltage drop difference between the central portion of the side and the end portions of the side can be reduced, making it possible to realize uniformization of the light emission luminance over the whole part of the panel surface of the display panel 70.

Note that a case of application of the present disclosure to the contact structure of the cathode electrode 109 according to Example 1 in which the shape of the projected portions 108$_{-1}$ has a rectangular shape has been taken as an example in Example 3, but the present disclosure is also similarly applicable to the contact structure of the cathode electrode 109 according to Example 2 in which the shape of the projected portions 108$_{-1}$ is a triangular shape or an arcuate shape.

In addition, by setting the shape of the projected portions 108$_{-1}$ at the central portion of the side, in the contact structure of the cathode electrode 109 according to Example 1 in which the pitch of the projected portions 108$_{-1}$ is constant, to be a triangular shape or an arcuate shape in place of a rectangular shape, the same operations and effects as in Example 3 can be obtained. Specifically, for example, by setting the shape of the projected portions 108$_{-1}$ at the end portions of each side of the film formation area of the organic EL layer 108 that has a rectangular shape to be a rectangular shape while setting the shape of the projected portions 108$_{-1}$ at the central portion of the side to be a triangular shape or an arcuate shape, the peripheral length of the film formation end of the organic EL layer 108 at the central portion of the side can be made longer than that at the end portions of the side. Accordingly, the same operations and effects as in Example 3 can be obtained.

Example 4

Example 4 is a modification of Example 1, and is an example in which the projected and recessed shape at the end portion of the film formation area of the organic EL layer 108 has a variation in density of the pitch of the projected portions 108$_{-1}$ according to the distance from a power source supply terminal to the cathode contact electrode. A schematic configuration, in plan view, of the contact structure of the cathode electrode 109 according to Example 3 is depicted in FIG. 10.

Figure 9B:
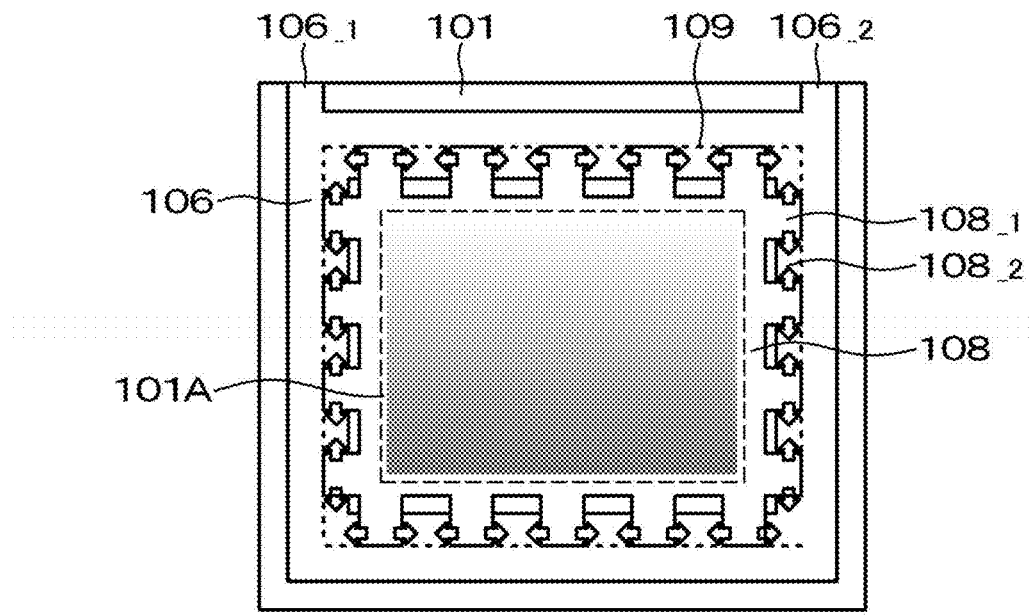
FIG. 9B is a diagram depicting a difference in light emission luminance attendant on a difference in distance from a cathode contact electrode to a power source supply terminal.

As depicted in FIG. 10, the conductive layer 106 serving as a cathode contact electrode has, for example, two power source supply terminals 106$_{-1}$ and 106$_{-2}$ which are electrically connected to a power source section (inclusive of earth connection) in the exterior of the display panel 70. In the display panel 70 in which the cathode contact electrode has the power source supply terminals 106$_{-1}$ and 106$_{-2}$, voltage drop increases in going farther from the power source supply terminals 106$_{-1}$ and 106$_{-2}$; therefore, as depicted in FIG. 9B, in the display panel 70, light emission luminance on a side farther from the power source supply terminals 106$_{-1}$ and 106$_{-2}$ is decreased as compared to the light emission luminance on a side nearer to the power source supply terminals 106$_{-1}$ and 106$_{-2}$.

On the other hand, in the contact structure of the cathode electrode 109 according to Example 4, in the projected and recessed shape of the film formation area of the organic EL layer 108, the pitch of the projected portions 108$_{-1}$ on a side nearer to the power source supply terminals 106$_{-1}$ and 106$_{-2}$ is set to be coarse, whereas the pitch of the projected portions 108$_{-1}$ on a side farther from the power source supply terminals 106$_{-1}$ and 106$_{-2}$ is set to be dense. As a result, the peripheral length of the film formation end of the organic EL layer 108 on the side farther from the power source supply terminals $106_{\_1}$ and $106_{\_2}$ can be made longer than that on the nearer side, thereby enlarging the width of the current paths on the farther side as compared to that on the nearer side, and lowering resistance in the current paths. Consequently, a voltage drop difference between the nearer side and the farther side with respect to the power source supply terminals $106_{\_1}$ and $106_{\_2}$ can be reduced, thereby realizing uniformization of light emission luminance over the whole part of the panel surface of the display panel 70.

Note that while a case in which the conductive layer 106 serving as a cathode contact electrode has the power source supply terminals $106_{\_1}$ and $106_{\_2}$ on one side (in FIG. 10, the upper side) of the display panel 70 has been taken as an example here, there are cases in which the power source supply terminals $106_{\_1}$ and $106_{\_2}$ are present on two sides (in FIG. 10, the upper and lower sides) of the display panel 70. In this case, it is preferable, for example, to set the pitches of the projected portions $108_{\_1}$ on the upper side side and the lower side side of the display panel 70 to be equal, and to set the pitches of the projected portions $108_{\_1}$ on the right side side and the left side side of the display panel 70 to be dense at the central portion of the side and to be coarse on the end portion sides of the side.

In addition, while a case of application of the present disclosure to the contact structure of the cathode electrode 109 according to Example 1 in which the shape of the projected portions $108_{\_1}$ is a rectangular shape has been taken as an example in Example 4, the present disclosure is also applicable to the contact structure of the cathode electrode 109 according to Example 2 in which the shape of the projected portions $108_{\_1}$ is a triangular shape or an arcuate shape.

Besides, in the contact structure of the cathode electrode 109 according to Example 1 in which the pitch of the projected portions $108_{\_1}$ is constant, by setting the shape of the projected portions $108_{\_1}$ on a side farther from the power source supply terminals $106_{\_1}$ and $106_{\_2}$ to be a triangular shape or an arcuate shape in place of a rectangular shape, the same operations and effects as in Example 4 can also be obtained. Specifically, by setting the shape of the projected portions $108_{\_1}$ on the side nearer to the power source supply terminals $106_{\_1}$ and $106_{\_2}$ to be a rectangular shape while setting the shape of the projected portions $108_{\_1}$ on the farther side to be a triangular shape or an arcuate shape, the peripheral length of the film formation end of the organic EL layer 108 on the side farther from the power source supply terminals $106_{\_1}$ and $106_{\_2}$ can be made longer than that on the nearer side. Accordingly, the same operations and effects as in Example 4 can be obtained.

<Modifications>

While the technology of the present disclosure has been described above based on the preferred embodiments, the technology of the present disclosure is not limited to the above embodiments. The configurations and structures of the display device described in the above embodiments are illustrative, and can be modified as required. For example, while it is assumed that the organic EL elements 21 and the drive circuits therefor are formed over a semiconductor such as silicon in the above embodiments, this is not limitative, and it is possible to form them over an insulating material such as glass.

In addition, while the circuit configuration depicted in FIG. 2 has been illustrated as an example of the pixel circuit in the above embodiments, this is not limitative, and it is possible, for example, to add transistors as required. For instance, it is possible to connect a switching transistor between a drain electrode of the drive transistor 22 and a current discharge destination node (for example, the common power source line 34), and to perform by the switching transistor such a control that the organic EL element 21 does not emit light in a non-light-emission period of the pixel 20.

<Electronic Apparatus of the Present Disclosure>

The display device of the present disclosure described above can be used as a display section (display device) of electronic apparatuses in any field in which a video signal inputted into an electronic apparatus or a video signal produced in an electronic apparatus is displayed as an image or a video image. Examples of the electronic apparatuses include television sets, notebook personal computers, digital still cameras, portable terminal devices such as mobile phones, and head-mounted displays. It is to be noted, however, that these examples are not limitative.

As described above, by using the display device of the present disclosure as a display section of an electronic apparatus in any field, the following effects can be obtained. Specifically, according to the display device of the present disclosure, the frame of a display panel can be narrowed. Therefore, by using the display device of the present disclosure, it is possible to contribute to a reduction in size of an electronic apparatus main body.

The display device of the present disclosure includes those in a module shape having a sealed configuration. A relevant example is a display module formed by adhering a counter section such as a transparent glass to a pixel array section. Note that the display module may be provided with a circuit section or a flexible printed circuit (FPC) for input/output of signals and the like from the exterior to the pixel array section. A digital still camera and a head-mounted display will be described below as specific examples of an electronic apparatus using the display device of the present disclosure. It is to be noted, however, that the specific examples which will be described here are mere examples, and are not limitative.

Specific Example 1

Figure 11A:
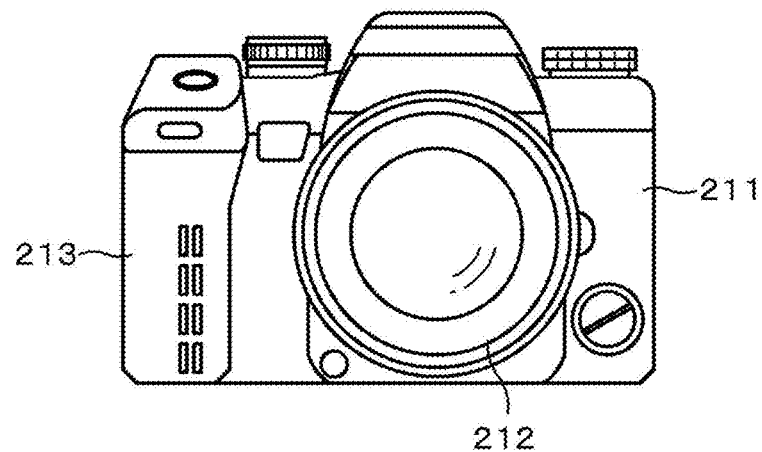
FIG. 11A is a front view of a digital still camera of a lens interchangeable single-lens reflex type according to Specific Example 1 of an electronic apparatus of the present disclosure.
Figure 11B:
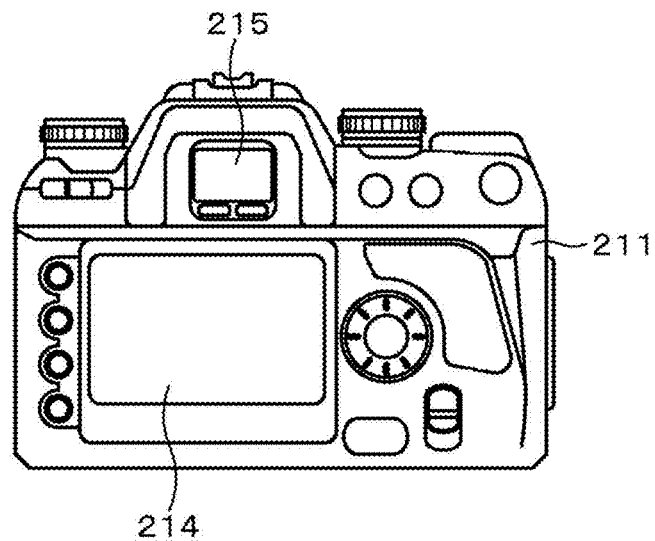
FIG. 11B is a back elevation thereof.

FIG. 11 depicts external views of a digital still camera of a lens interchangeable single-lens reflex type according to Specific Example 1 of the electronic apparatus of the present disclosure, wherein FIG. 11A is a front view thereof, and FIG. 11B is a back elevation thereof.

The lens interchangeable single-lens reflex type digital still camera according to Specific Example 1 includes, for example, an interchangeable type photographic lens unit (interchangeable lens) 212 on the right side of the front side of a camera main body section (camera body) 211, and a grip section 213 on the left side of the front side to be gripped by the photographer.

In addition, a monitor 214 is provided substantially in the center of the back surface of the camera main body section 211. An electronic view finder (eyepiece window) 215 is provided at an upper portion of the monitor 214. By peeping through the electronic view finder 215, the photographer can visually recognize an optical image of a subject led through the photographic lens unit 212, and can determine a composition.

In the lens interchangeable single-lens reflex type digital still camera configured as described above, the display device of the present disclosure can be used as the electronic view finder 215. In other words, the lens interchangeable single-lens reflex type digital still camera according to Specific Example 1 will be manufactured using the display device of the present disclosure as the electronic view finder 215 thereof.

Specific Example 2

Figure 12:
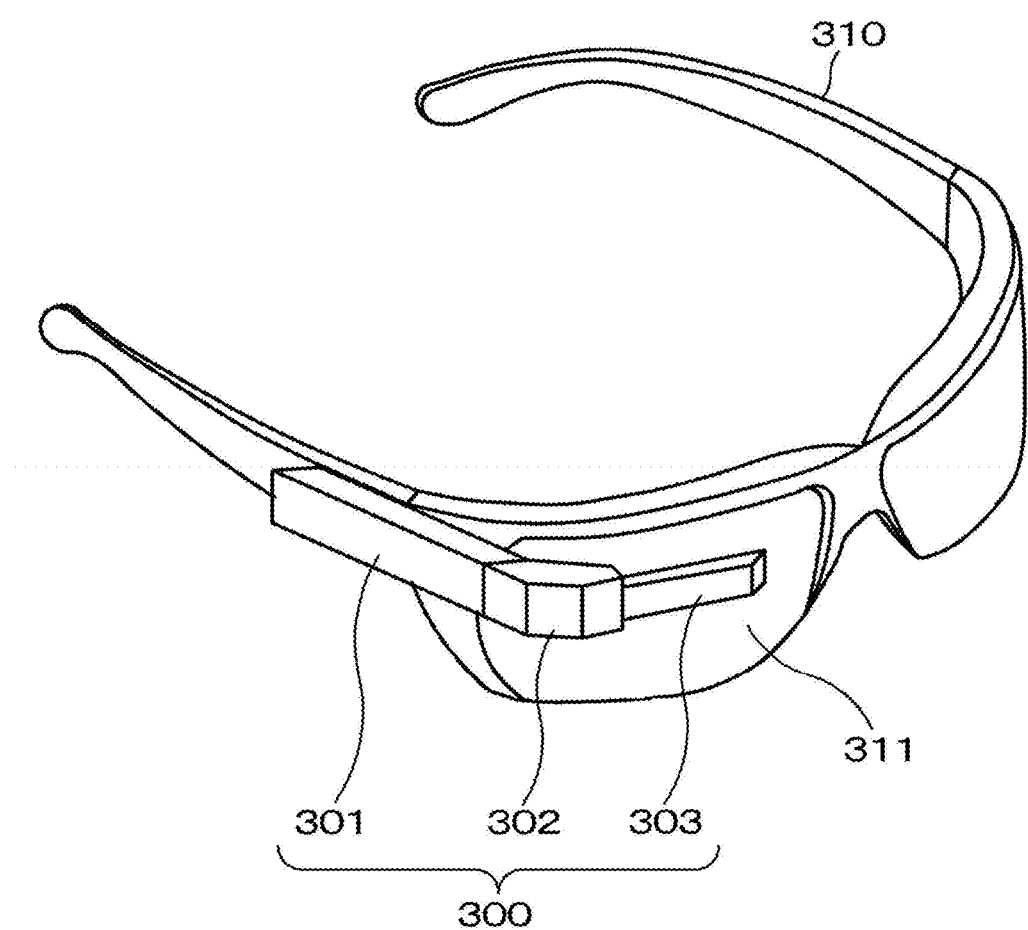
FIG. 12 is an external view depicting an example of a head-mounted display according to Specific Example 2 of the electronic apparatus of the present disclosure.

FIG. 12 is an external view depicting an example of a head-mounted display according to Specific Example 2 of the electronic apparatus of the present disclosure.

A head-mounted display 300 according to Specific Example 2 is configured as a transmission type head-mounted display including a main body section 301, an arm section 302 and a lens barrel 303. The main body section 301 is connected to the arm section 302 and spectacles 310. Specifically, an end portion in the longitudinal direction of the main body section 301 is attached to the arm section 302. In addition, one side of a side surface of the main body section 301 is linked to the spectacles 310 through a connection member (not illustrated). Note that the main body section 301 may be directly mounted to a human head.

The main body section 301 incorporates therein a control substrate for controlling an operation of the head-mounted display 300 and a display section. By linking the main body section 301 and the lens barrel 303, the arm section 302 supports the lens barrel 303 relative to the main body section 301. Specifically, by being coupled to an end portion of the main body section 301 and an end portion of the lens barrel 303, the arm section 302 fixes the lens barrel 303 to the main body section 301. In addition, the arm section 302 incorporates a signal line for transmitting data concerning an image provided from the main body section 301 to the lens barrel 303.

The lens barrel 303 projects image light, which is provided from the main body section 301 through the arm section 302, to the eye of the user on whom the head-mounted display 300 is mounted, through a lens 311 in the spectacles 310.

In the head-mounted display 300 configured as described above, the display device of the present disclosure can be used as the display section incorporated in the main body section 301. In other words, the head-mounted display 300 according to Specific Example 2 will be manufactured using the display device of the present disclosure as the display section thereof.

<Configurations That Can be Adopted by the Present Disclosure>

Note that the present disclosure can also adopt the following configurations.

<<A. Display Device>>

[A-1] A display device including:

an organic EL layer formed over a circuit section formed over a substrate, with an insulating film interposed between the circuit section and the organic EL layer;

a cathode electrode formed over the organic EL layer in common for all pixels; and a contact electrode that is provided at an outer peripheral portion of an effective pixel region and electrically connects the cathode electrode with the circuit section, in which the cathode electrode is electrically connected to the contact electrode, on an inner side as compared to an end surface of a film formation area of the organic EL layer.

[A-2] The display device as described in the above paragraph [A-1], in which an end portion of the film formation area of the organic EL layer has a projected and recessed shape in a side direction, and the cathode electrode is electrically connected to the contact electrode at a recessed portion of the projected and recessed shape at the end portion of the film formation area of the organic EL layer.

[A-3] The display device as described in the above paragraph [A-2], in which a projected portion of the projected and recessed shape at the end portion of the film formation area of the organic EL layer has a rectangular shape, a triangular shape or an arcuate shape.

[A-4] The display device as described in the above paragraph [A-2] or [A-3], in which in the projected and recessed shape at the end portion of the film formation area of the organic EL layer, a pitch of the projected portions varies in density.

[A-5] The display device as described in the above paragraph [A-4], in which in the projected and recessed shape at the end portion of the film formation area of the organic EL layer, the pitch of the projected portions at a central portion of a side is dense, and the pitch of the projected portions at the end portions of the side is coarse.

[A-6] The display device as described in the above paragraph [A-4], in which the cathode electrode has a power source supply terminal, and in the projected and recessed shape at the end portion of the film formation area of the organic EL layer, the pitch of the projected portions on a side nearer to the power source supply terminal of the cathode electrode is coarse, and the pitch of the projected portions on a side farther from the power source supply terminal is dense.

<<B. Electronic Apparatus>>

[B-1] An electronic apparatus including a display device, the display device including:

an organic EL layer formed over a circuit section formed over a substrate, with an insulating film interposed between the circuit section and the organic EL layer;

a cathode electrode formed over the organic EL layer in common for all pixels; and a contact electrode that is provided at an outer peripheral portion of an effective pixel region and electrically connects the cathode electrode and the circuit section, in which the cathode electrode is electrically connected to the contact electrode, on an inner side as compared to an end surface of a film formation area of the organic EL layer.

[B-2] The electronic apparatus as described in the above paragraph [B-1], in which an end portion of the film formation area of the organic EL layer has a projected and recessed shape in a side direction, and the cathode electrode is electrically connected to the contact electrode at a recessed portion of the projected and recessed shape at the end portion of the film formation area of the organic EL layer.

[B-3] The electronic apparatus as described in the above paragraph [B-2], in which a projected portion of the projected and recessed shape at the end portion of the film formation area of the organic EL layer has a rectangular shape, a triangular shape or an arcuate shape.

[B-4] The electronic apparatus as described in the above paragraph [B-2] or [B-3], in which in the projected and recessed shape at the end portion of the film formation area of the organic EL layer, a pitch of the projected portions varies in density.

[B-5] The electronic apparatus as described in the above paragraph [B-4], in which in the projected and recessed shape at the end portion of the film formation area of the organic EL layer, the pitch of the projected portions at a central portion of a side is dense, and the pitch of the projected portions at end portions of the side is coarse.

[B-6] The electronic apparatus as described in the above paragraph [B-4], in which the cathode electrode has a power source supply terminal, and in the projected and recessed shape at the end portion of the film formation area of the organic EL layer, the pitch of the projected portions on a side nearer to the power source supply terminal of the cathode electrode is coarse, and the pitch of the projected portions on a side farther from the power source supply terminal is dense.

REFERENCE SIGNS LIST

10 . . . Organic EL display device, 20 . . . Pixel (Pixel circuit), 21 . . . Organic EL element, 22 . . . Drive transistor, 23 . . . Sampling transistor, 24 . . . Light emission control transistor, 25 . . . Storage capacitor, 26 . . . Auxiliary capacitor, 30 . . . Pixel array section, 40 . . . Write scanning section, 50 . . . Drive scanning section, 60 . . . Signal output section, 70 . . . Display panel, 101 . . . Substrate, 101A . . . Effective pixel region (Display region), 101B . . . Peripheral region, 102 . . . Circuit layer, 102A . . . Pixel drive circuit, 102B . . . Peripheral circuit, 103 . . . Inorganic insulating layer, 104 . . . Organic insulating layer, 105 . . . Anode electrode (Lower electrode), 106 . . . Conductive layer (Cathode contact electrode), 106_1, 106_2 . . . Power source supply terminal, 107 . . . Organic insulating layer, 108 . . . Organic EL layer, 108_1 . . . Projected portion of projected and recessed shape, 108_2 . . . Recessed portion of projected and recessed shape, 109 . . . Cathode electrode (Upper electrode), 110 . . . Protective layer, 111 . . . Filler layer (Adhesion layer), 112 . . . Sealing agent, 113 . . . Black matrix layer, 114 . . . Sealing substrate, 115 . . . Color filter

The invention claimed is:

1. A display device comprising:
a substrate including a surface extending in a first direction, a circuit section formed over the surface of the substrate;
an organic EL layer formed over the circuit section in a second direction perpendicular to the first direction;
an insulating film interposed between the circuit section and the organic EL layer;
a cathode electrode formed over the organic EL layer in common for a plurality of pixels of the display device; and
a contact electrode that is located at an outer peripheral portion of an effective pixel region and electrically connects the cathode electrode with the circuit section, wherein
the cathode electrode is electrically connected to the contact electrode at a location closer to the surface of the substrate than an upper surface of the organic EL layer.

2. The display device according to claim 1, wherein
the organic EL layer has a projected portion and a recessed portion, the recessed portion being closer to the surface of the substrate than the projected portion, and the location where the cathode electrode is electrically connected to the contact electrode is closer to the recessed portion than to the projected portion.

3. The display device according to claim 2, wherein
the projected portion and the recessed portion form a rectangular shape, a triangular shape or an arcuate shape.

4. The display device according to claim 2, wherein
the projected portion and the recessed portion are respectively one of a plurality of projected portions and a plurality of recessed portions of the organic EL layer, and a pitch of the projected portions varies in density.

5. The display device according to claim 4, wherein
the pitch of the projected portions is more dense at locations closer to a first side of the effective pixel region than at locations closer to a second side of the effective pixel region.

6. The display device according to claim 4, wherein
the cathode electrode has a power source supply terminal, and
the pitch of the projected portions on a side of the effective pixel region that is nearer to the power source supply terminal of the cathode electrode is coarse relative to the pitch of the projected portions on a side of the effective pixel region that is farther from the power source supply terminal.

7. An electronic apparatus comprising a display device, the display device including:
a substrate including a surface extending in a first direction, a circuit section formed over the surface of the substrate;
an organic EL layer formed over the circuit section in a second direction perpendicular to the first direction;
an insulating film interposed between the circuit section and the organic EL layer;
a cathode electrode formed over the organic EL layer in common for a plurality of pixels of the display device; and
a contact electrode that is located at an outer peripheral portion of an effective pixel region and electrically connects the cathode electrode with the circuit section, wherein
the cathode electrode is electrically connected to the contact electrode at a location closer to the surface of the substrate than an upper surface of the organic EL layer.

8. The electronic apparatus according to claim 7, wherein
the organic EL layer has a projected portion and a recessed portion, the recessed portion being closer to the surface of the substrate than the projected portion, and
the location where the cathode electrode is electrically connected to the contact electrode is closer to the recessed portion than to the projected portion.

9. The electronic apparatus according to claim 8, wherein
the projected portion and the recessed portion form a rectangular shape, a triangular shape or an arcuate shape.

10. The electronic apparatus according to claim 8, wherein
the projected portion and the recessed portion are respectively one of a plurality of projected portions and a plurality of recessed portions of the organic EL layer, and a pitch of the projected portions varies in density.

11. The electronic apparatus according to claim 10, wherein the pitch of the projected portions is more dense at locations closer to a first side of the effective pixel region than at locations closer to a second side of the effective pixel region.

12. The electronic apparatus according to claim 10, wherein the cathode electrode has a power source supply terminal, and the pitch of the projected portions on a side of the effective pixel region that is nearer to the power source supply terminal of the cathode electrode is coarse relative to the pitch of the projected portions on a side of the effective pixel region that is farther from the power source supply terminal.

* * * * *